(12) United States Patent
Sandhu

(10) Patent No.: US 7,497,958 B2
(45) Date of Patent: Mar. 3, 2009

(54) METHODS OF FORMING CAPACITORS

(75) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 94 days.

(21) Appl. No.: 11/472,598

(22) Filed: Jun. 21, 2006

(65) Prior Publication Data

US 2007/0048630 A1    Mar. 1, 2007

Related U.S. Application Data

(63) Continuation of application No. 10/903,295, filed on Jul. 29, 2004.

(51) Int. Cl.
*H01L 21/302* (2006.01)

(52) U.S. Cl. .................... 216/2; 438/8; 438/9

(58) Field of Classification Search ............ 216/2
See application file for complete search history.

(56) References Cited

U.S. PATENT DOCUMENTS

| | | | |
|---|---|---|---|
| 4,784,721 A | 11/1988 | Holmen et al. | |
| 5,306,941 A | 4/1994 | Yoshida | |
| 5,849,644 A * | 12/1998 | Schuegraf | 438/790 |
| 5,930,585 A | 7/1999 | Coronel et al. | |
| 6,165,911 A | 12/2000 | Calveley | |
| 6,218,309 B1 | 4/2001 | Miller et al. | |
| 6,365,059 B1 | 4/2002 | Pechenik | |
| 6,387,387 B1 | 5/2002 | Haniu et al. | |
| 6,461,888 B1 | 10/2002 | Sridhar et al. | |
| 6,649,452 B2 | 11/2003 | Lucas et al. | |
| 6,661,051 B1 * | 12/2003 | Durcan et al. | 257/306 |
| 6,696,220 B2 | 2/2004 | Bailey et al. | |
| 6,730,617 B2 | 5/2004 | Carter | |
| 6,743,368 B2 | 6/2004 | Lee | |
| 2001/0015453 A1 * | 8/2001 | Agarwal | 257/310 |
| 2001/0040145 A1 * | 11/2001 | Willson et al. | 216/52 |
| 2002/0018849 A1 | 2/2002 | George et al. | |
| 2003/0219992 A1 | 11/2003 | Schaper | |

OTHER PUBLICATIONS

Bailey, T. et al., "Step and Flash Imprint Lithography: A Technology Review", Future Electron Devices, vol. 11, No. 4 (2000), pp. 54-67.

(Continued)

*Primary Examiner*—Binh X Tran
*Assistant Examiner*—Patricia A George
(74) *Attorney, Agent, or Firm*—Wells St. John P.S.

(57) ABSTRACT

The invention includes methods of forming reticles configured for imprint lithography, methods of forming capacitor container openings, and methods in which capacitor container openings are incorporated into DRAM arrays. An exemplary method of forming a reticle includes formation of a radiation-imageable layer over a material. A lattice pattern is then formed within the radiation-imageable layer, with the lattice pattern defining a plurality of islands of the radiation-imageable layer. The lattice-patterned radiation-imageable layer is utilized as a mask while subjecting the material under the lattice-patterned layer to an etch which transfers the lattice pattern into the material. The etch forms a plurality of pillars which extend only partially into the material, with the pillars being spaced from one another by gaps. The gaps are subsequently narrowed with a second material which only partially fills the gaps.

7 Claims, 12 Drawing Sheets

OTHER PUBLICATIONS

Mancini, D. et al., "S-FIL for Sub-80nm Contact Hole Patterning", Solid State Technology Magazine, vol. 47, Issue 2, Feb. 2004, 4 pages.

"Imprint Lithography", http://www.physik.uni-wuerzburg.de/TEP/Website/groups/nanodevices/imprint/imprint.htm, reprinted Jun. 10, 2004, 3 pages.

Charlton; M. et al., "Fabrication of High Aspect Ratio Silicon Microstructures by Anodic Etching", J. Micromech. Microeng. 7(1997 IOP Publishing Ltd.), pp. 155-158.

Faircloth, B. et al., "Bilayer, Nanoimprint Lithography", J. Vac. Sci. Technol. B 18(4), Microelectronics and Nanometer Structures, Jul./Aug. 2000, pp. 1866-1873.

Chang, A.S.P.; A new two-dimensional subwavelength resonant grating filter fabricated by nanoimprint lithiography; Dept. of Electr. Eng., Princeton Univ., NJ, USA; This paper appears in: Lasers and Electro-Optics Society, 2001. LEOS 2001. The 14th Annual Meeting of the IEEE Publication Date: Nov. 12-13, 2001.

* cited by examiner

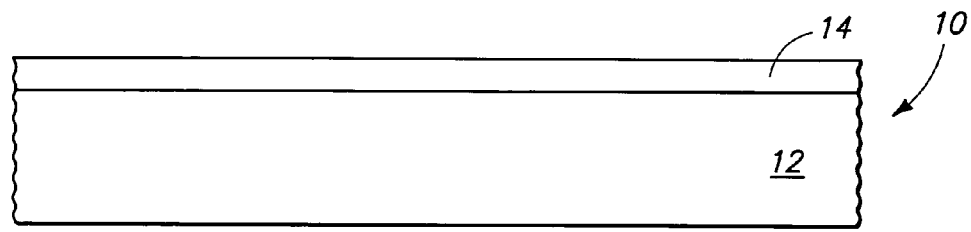
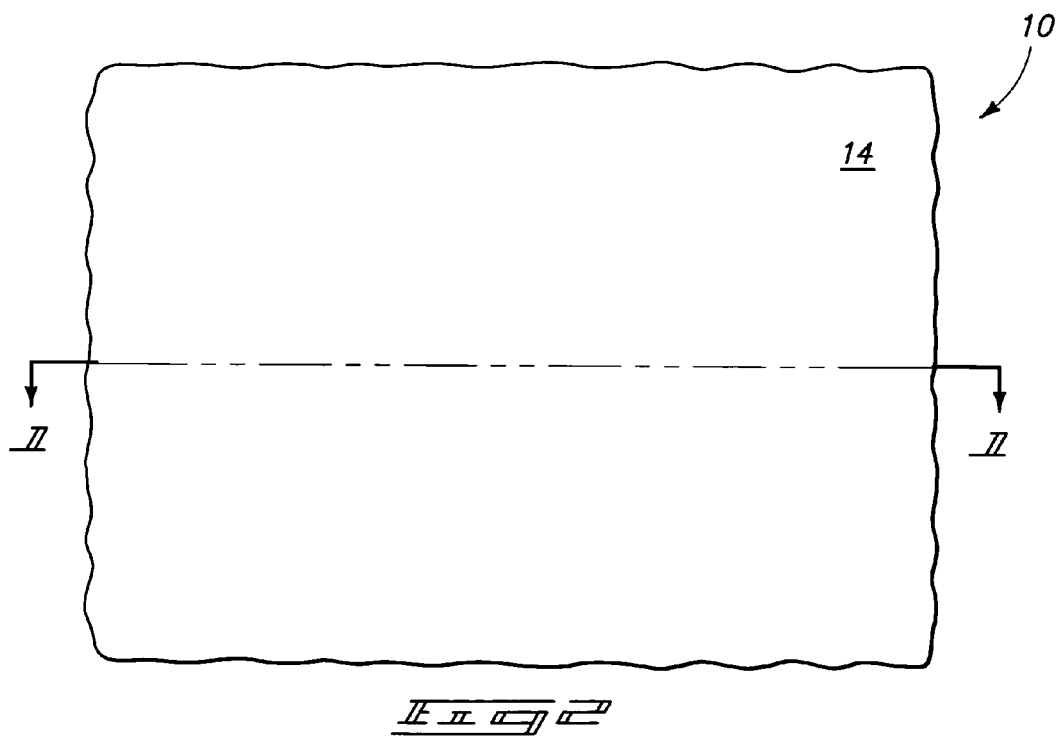

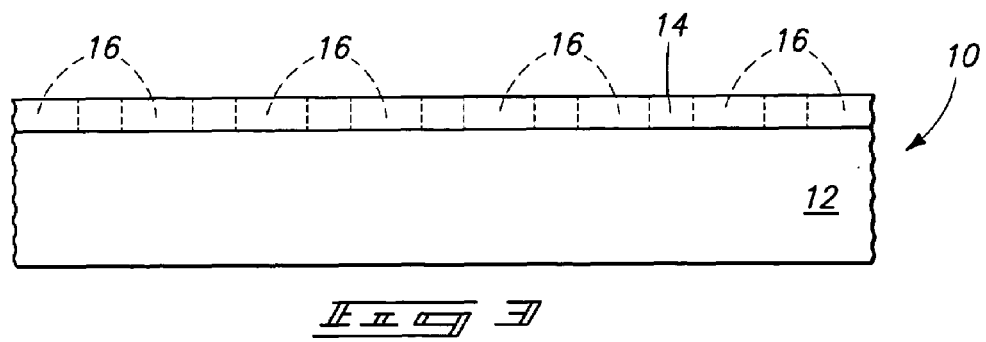
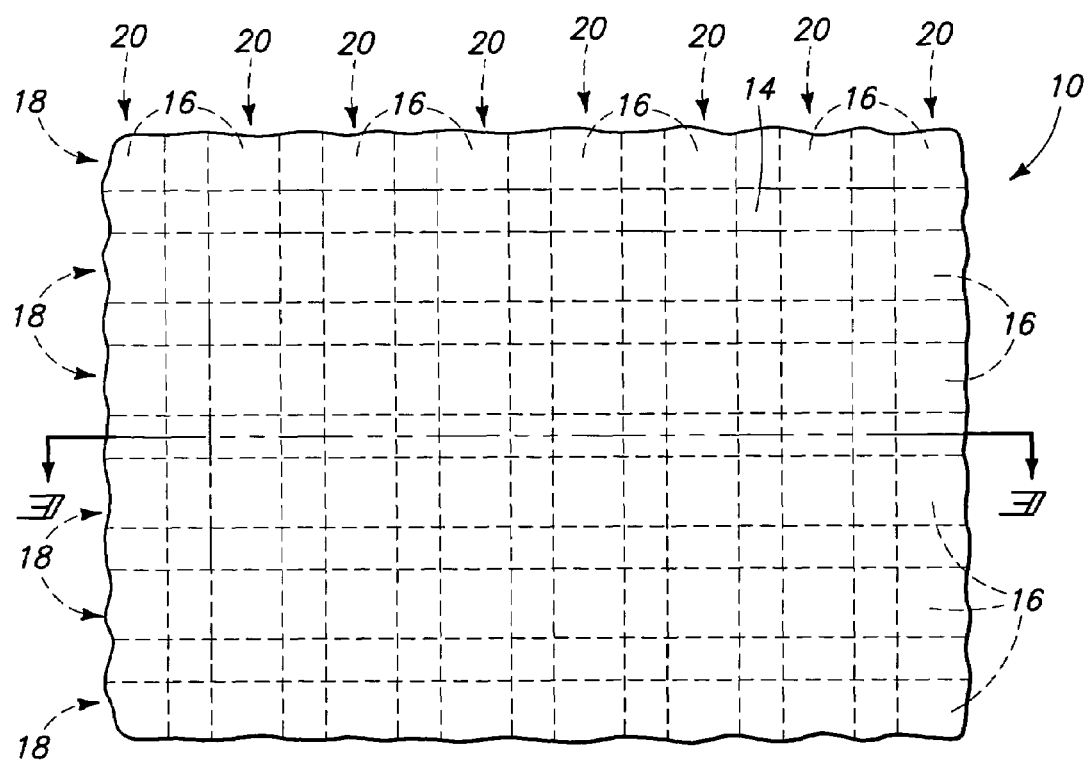

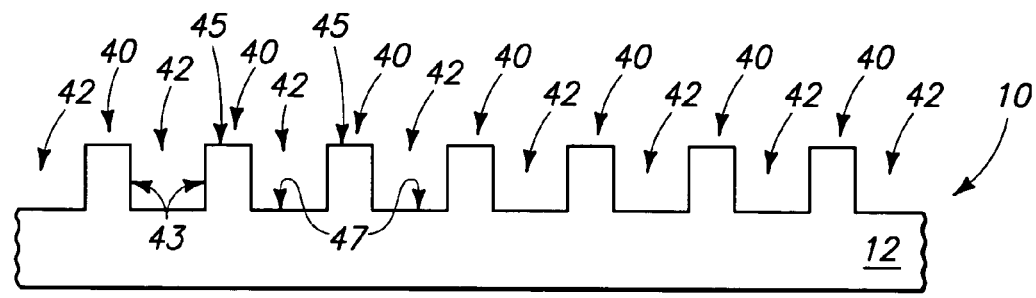
_FIG. 7_
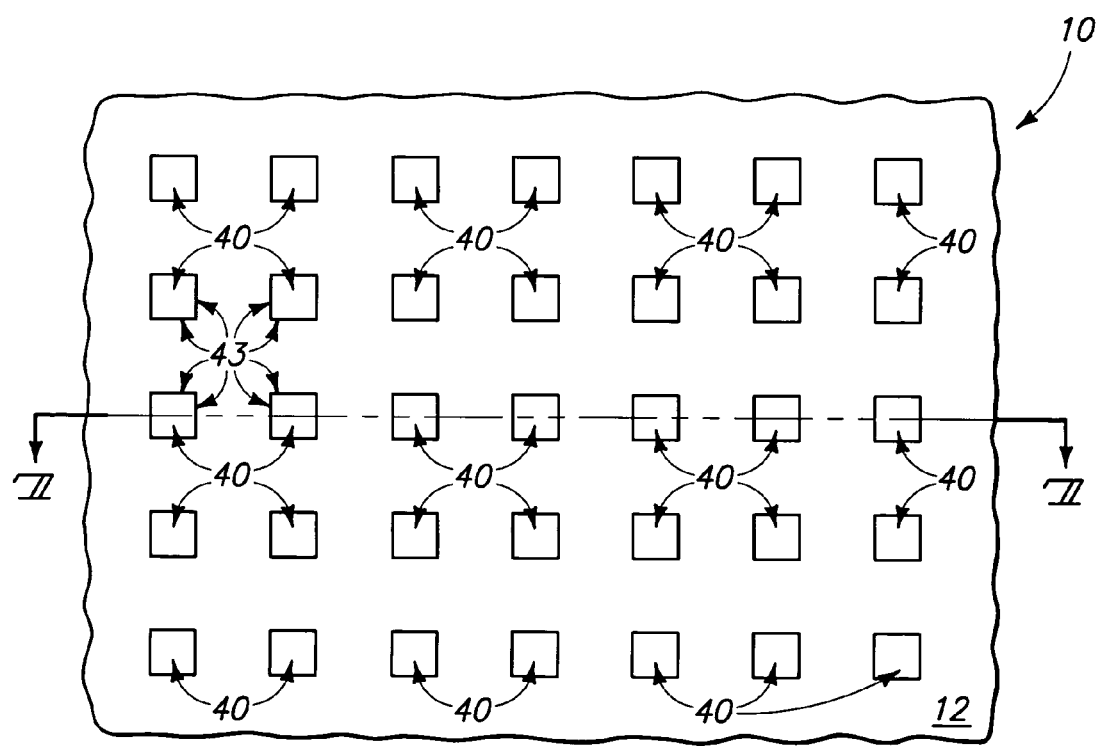
_FIG. 8_

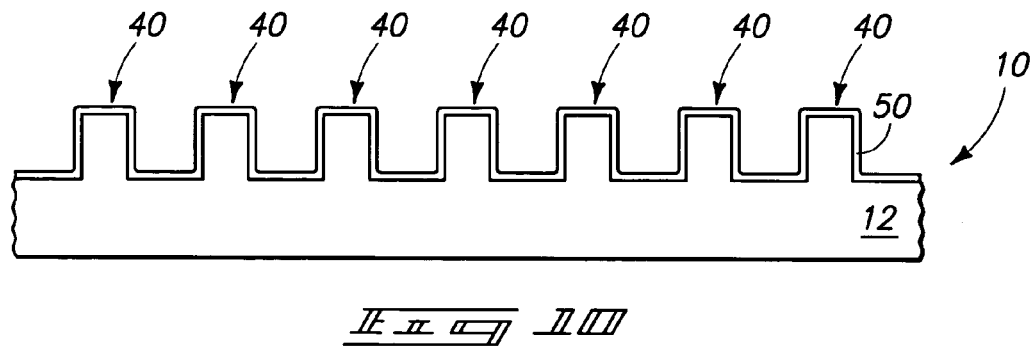
_FIG. 10_
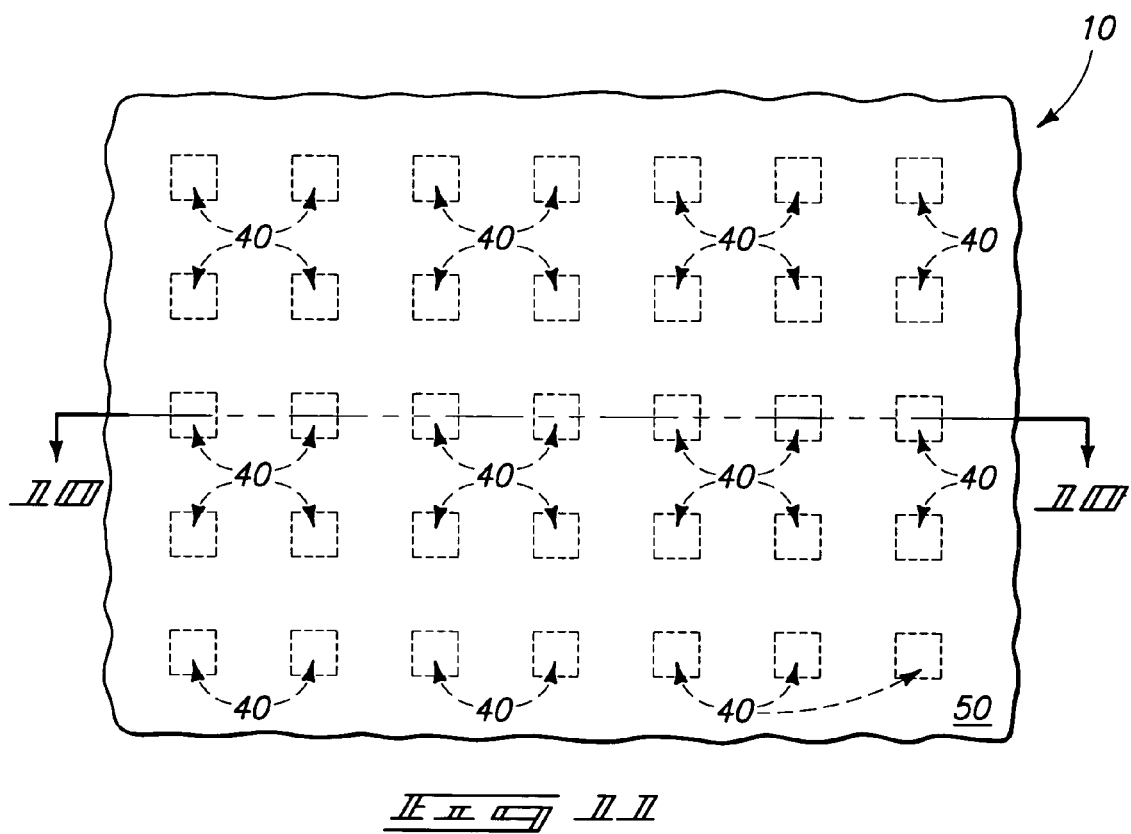
_FIG. 11_

_Fig. 21_
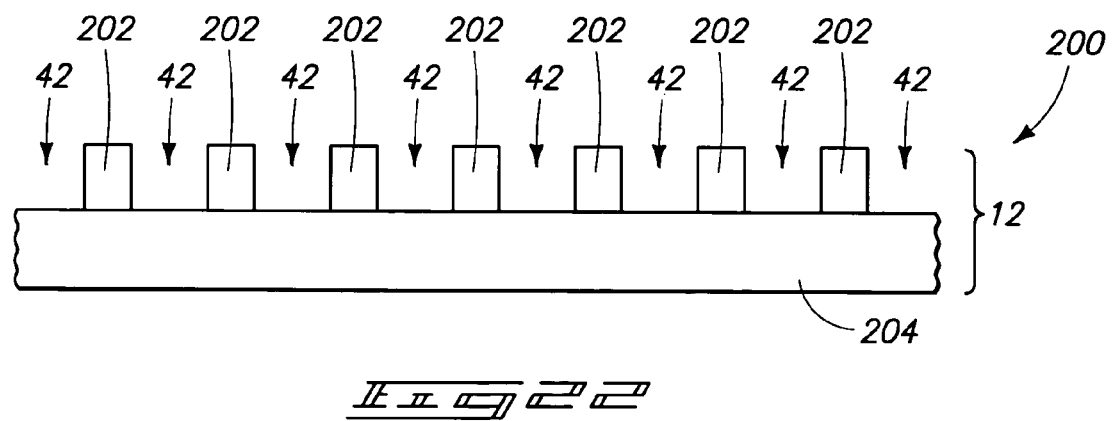
_Fig. 22_

US 7,497,958 B2

METHODS OF FORMING CAPACITORS

RELATED PATENT DATA

This patent resulted from a continuation of U.S. patent application Ser. No. 10/903,295, filed Jul. 29, 2004, which is hereby incorporated byreference.

TECHNICAL FIELD

The invention pertains to methods of forming patterns in semiconductor constructions, methods of forming container capacitors, and methods of forming reticles configured for imprint lithography.

BACKGROUND OF THE INVENTION

Various methods have been developed for patterning semiconductor constructions. Among such methods is imprint lithography. Imprint lithography involves pressing an imprint reticle into a moldable material to form a pattern in the moldable material, and subsequently transferring the pattern to a semiconductor construction underlying the moldable material. Numerous versions of imprint lithography have been developed, including, for example, techniques in which imprinting is conducted into a thermoplastic or thermoset polymer, and techniques in which imprinting is conducted into light-curable materials.

Imprint lithography is being developed as an alternative approach to optical lithography (so-called photolithography), and may enable formation of patterns having feature widths less than those attainable by photolithography. Accordingly, there is a desire to develop procedures for applying imprint lithography techniques to the fabrication of semiconductor constructions.

One type of semiconductor construction which has wide application is a dynamic random access memory (DRAM) device. DRAM devices comprise a charge storage unit (typically a capacitor) electrically connected with a transistor. DRAM devices are usually formed in large arrays across semiconductor substrates, and there is a continuing desire to increase the packing density of such arrays and thereby attain increasing levels of integration.

SUMMARY OF THE INVENTION

In one aspect, the invention encompasses a method of forming a reticle configured for imprint lithography. A reticle substrate containing a first material is provided. A radiation-imageable layer is formed over the first material. A lattice pattern is formed within the radiation-imageable layer, with the lattice defining a plurality of islands of the radiation-imageable layer. The lattice-patterned radiation-imageable material is utilized as a mask while the first material is subjected to an etch which transfers the lattice pattern into the first material. The etch forms a plurality of pillars which extend only partially into the first material, with such pillars being spaced from one another by gaps. The gaps are narrowed with a second material which only partially fills the gaps. In particular aspects, the reticle can be utilized for patterning semiconductor constructions, such as, for example, for forming openings in a semiconductor substrate. Subsequently, container capacitors can be formed within the openings. The container capacitors can be packed to a high density across the semiconductor substrate, and can be incorporated into a dynamic random access memory (DRAM) array.

In an exemplary method of forming container capacitors, a semiconductor construction is provided and a moldable material is formed over the semiconductor construction. A reticle is provided which has a patterning surface. The patterning surface is pressed into the moldable material to form a pattern within the moldable material. The pattern substantially corresponds to an inverse image of the patterning surface. The pattern has a plurality of openings extending into the moldable material. The openings are extended into the semiconductor construction to form a plurality of container openings within the semiconductor construction. Capacitors are formed to extend into the container openings. At least some of the capacitors have first electrodes within the container openings, second electrodes within the container openings, and dielectric material between the first and second electrodes.

BRIEF DESCRIPTION OF THE DRAWINGS

Preferred embodiments of the invention are described below with reference to the following accompanying drawings.

FIGS. 1 and 2 are a diagrammatic cross-sectional view and top view, respectively, of a fragment of a reticle substrate at a preliminary processing stage of an exemplary aspect of the present invention. The cross-section of FIG. 1 is along the line 1-1 of FIG. 2.

FIGS. 3 and 4 are a diagrammatic cross-sectional view and top view, respectively, of the reticle substrate fragment of FIGS. 1 and 2 shown at processing stage subsequent to that of FIGS. 1 and 2. The cross-section of FIG. 3 is along the line 3-3 of FIG. 4.

FIGS. 7 and 8 are a diagrammatic cross-sectional view and top view, respectively, of the reticle substrate fragment of FIGS. 1 and 2 shown at a processing stage subsequent to that of FIGS. 5 and 6. The cross-section of FIG. 7 is along the line 7-7 of FIG. 8.

FIG. 9 is a three-dimensional view of a reticle substrate fragment shown at the processing stage of FIGS. 7 and 8.

FIGS. 10 and 11 are a diagrammatic, cross-sectional view and top view, respectively, of the reticle substrate fragment of FIGS. 1 and 2 shown at a processing stage subsequent to that of FIGS. 7 and 8. The cross-section of FIG. 10 is along the line 10-10 of FIG. 11.

FIG. 21 is a diagrammatic cross-sectional view of a reticle substrate fragment alternative to that of FIG. 1 shown at a preliminary processing stage.

FIG. 22 is a view of the reticle substrate fragment of FIG. 21 shown at a processing stage subsequent to that of FIG. 21.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

One aspect of the invention pertains to methods of forming a reticle, and another aspect of the invention pertains to methods of utilizing a reticle to pattern a semiconductor construction. FIGS. 1-13, 21 and 22 pertain to exemplary methods of forming a reticle, and FIGS. 14-20 pertain to an exemplary method of utilizing a reticle to pattern a semiconductor construction.

Referring initially to FIGS. 1 and 2, such illustrate a construction 10 at a preliminary processing stage of an exemplary aspect of the present invention for forming a reticle. Construction 10 comprises a reticle substrate 12 having a radiation-imageable layer 14 thereover. Reticle substrate 12 can comprise any suitable material or a combination of materials. In a particular aspect of the invention, reticle substrate 12 comprises, consists essentially of, or consists of quartz. For instance, reticle substrate 12 can be a homogeneous quartz composition throughout an entirety of the substrate. Alternatively, the substrate can comprise at least two layers, with the upper layer being selectively etchable to the lower layer under appropriate conditions (for instance, the substrate can contain layers selected from Si, calcium fluoride and $SiO_2$; and can, for example, comprise $SiO_2$ over Si). In other aspects of the invention (not shown) various opaque materials (such as, for example, chrome) and/or partially transparent materials can be included within substrate 12 so that the substrate is suitable for, for example, step and flash imprint lithography.

The radiation-imageable layer 14 can comprise any suitable radiation-imageable material, and can be formed to any suitable thickness. The radiation-imageable material of layer 14 comprises an appropriate composition such that exposure of a portion of the material to radiation changes solubility of such portion in a solvent relative to another portion which is not exposed to the radiation.

Referring next to FIGS. 3 and 4, construction 10 is illustrated after the radiation-imageable material of layer 14 has been exposed to patterned radiation. Such exposure has formed a lattice of regions 16 that will be more soluble in a solvent than other regions of the layer 14. The lattice can be considered to comprise a first series of lines 18 extending substantially horizontally in the top view of FIG. 4, and a second series of lines 20 extending substantially orthogonally to the lines 18.

In particular aspects, the pattern of FIG. 4 can be formed by exposing a suitable radiation-imageable material to electron beam radiation. In such aspects, regions of the material of layer 14 exposed to the electron beam radiation become the regions 16 which are more soluble in an appropriate solvent than other regions.

Figure 5:
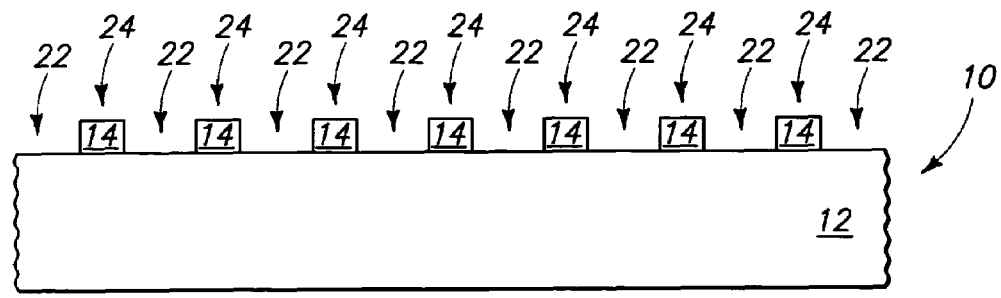
FIGS. 5 and 6 are a diagrammatic cross-sectional view and top view, respectively, of the reticle substrate fragment of FIGS. 1 and 2 shown at a processing stage subsequent to that of FIGS. 3 and 4. The cross-section of FIG. 5 is along the line 5-5 of FIG. 6.
Figure 6:
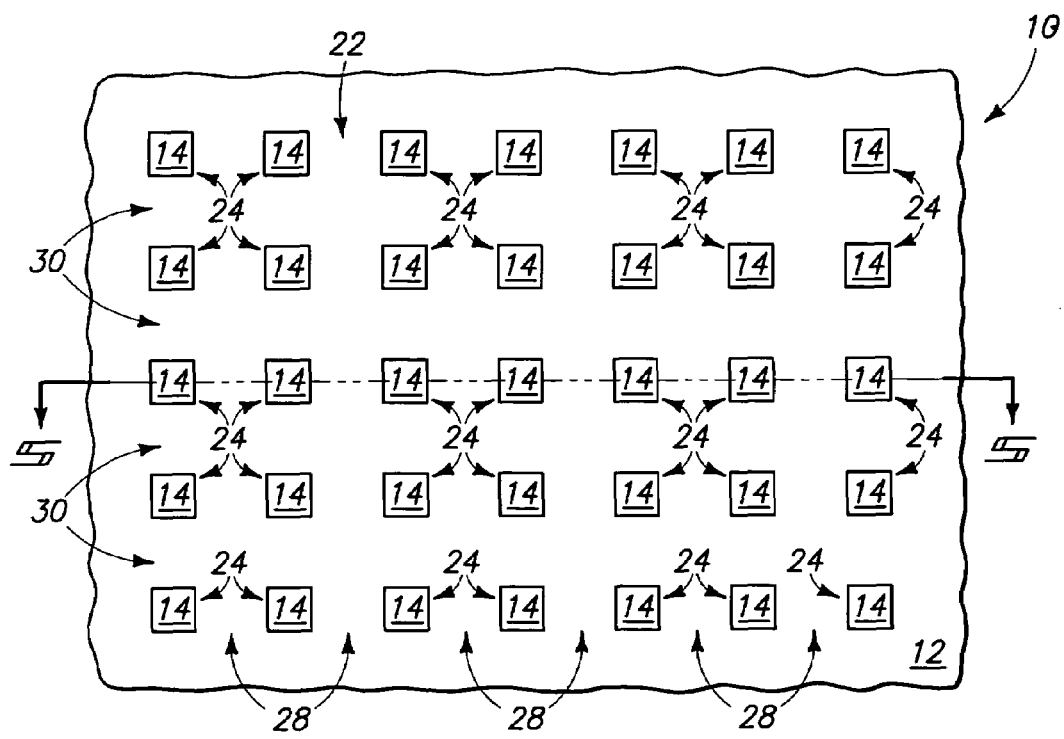
Figure 6:
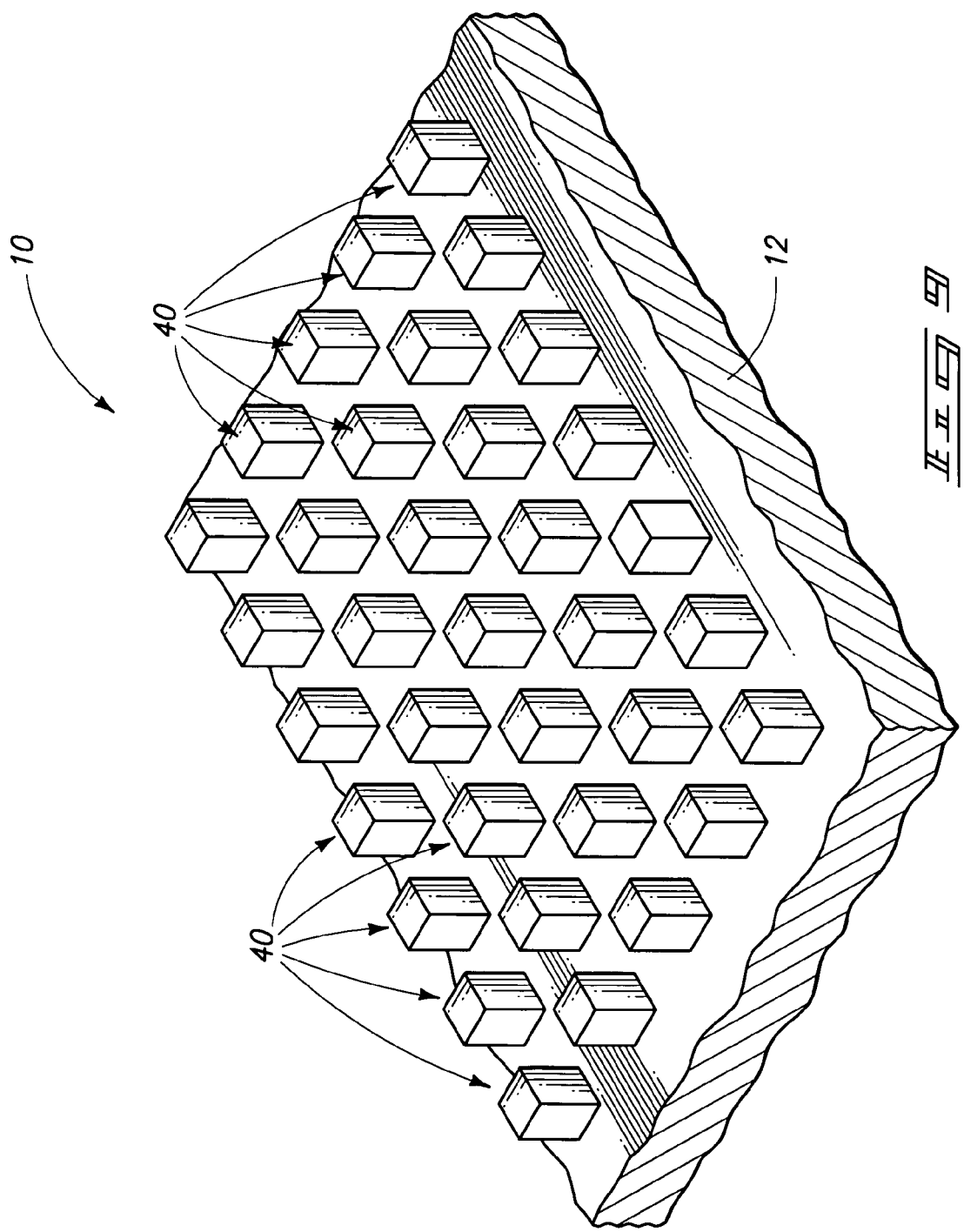

Referring next to FIGS. 5 and 6, the radiation-imageable material is exposed to the appropriate solvent so that the regions 16 (FIG. 4) are removed, which forms a lattice pattern of trenches 22 extending through the radiation-imageable material. The lattice pattern of the trenches defines the remaining radiation-imageable layer into a plurality of islands 24. The trenches 22 can be considered to comprise a first series of trenches 28 extending in a first direction and a second series of trenches 30 extending in a second direction substantially orthogonal to the first direction. In the shown aspect of the invention, the first and second series of trenches are shown to be substantially straight lines. It is to be understood, however, that the invention also encompasses aspects (not shown) wherein one or both of the first series of trenches and second series of trenches comprises curved lines. Such aspect can be generated by, for example, forming one or both of the series of lines 18 and the series of lines 20 to contain curved lines, rather than the shown straight lines of FIG. 4.

The shown islands 24 of FIG. 6 have polygonal lateral peripheries, and in the specific aspect of the invention of FIG. 6 are rectangular (more specifically, square). It can be advantageous that the islands have square lateral peripheries (for reasons discussed below), but it is to be understood that the islands can have any suitable shape for various applications and accordingly that the shown square shape of the islands is but one example of a suitable shape for the islands.

Referring next to FIGS. 7 and 8, the lattice pattern of trenches 22 (FIGS. 5 and 6) is transferred to the underlying substrate 12, and subsequently patterned layer 14 (FIGS. 5 and 6) is removed. The etch utilized to transfer the pattern from the patterned mask of imageable material 14 to underlying substrate 12 can be any suitable etch. In applications in which substrate 12 comprises, consists essentially of, or consists of quartz, the etch can utilize, for example, one or more fluorine-containing compositions. If the substrate comprises multiple layers, the etch can extend through a topmost layer and stop on an underlying layer if appropriate materials and conditions are chosen. For instance, a pair of layers can comprise different compositions relative to one another, with such compositions being selected from the group consisting of Si, $SiO_2$ and calcium fluoride, and the etch can extend through one of the layers to stop on another. In a particular example, the topmost layer can consist essentially of, or consist of, silicon dioxide; and the underlying layer can consist essentially of, or consist of, silicon. Utilization of substrates comprising multiple layers is discussed below with reference to FIGS. 21 and 22.

In the aspect of the invention shown in FIGS. 7 and 8, substrate 12 can be considered to homogeneously comprise a first material, and the shown patterning of substrate 12 forms a plurality of pillars 40 from the first material. The pillars extend only partially into the first material, rather than extending entirely through the first material.

The pillars 40 are separated from one another by gaps 42. The pillars have lateral surfaces 43 (only some of which are labeled) along the gaps, and have top surfaces 45 (only some of which are labeled) at uppermost portions of the pillars.

Substrate 12 comprises segments 47 (only some of which are labeled) within the gaps and between the pillars.

The pillars 40 comprise the polygonal lateral periphery defined by islands 24 (FIGS. 5 and 6) of imageable material, and in the shown aspect of the invention comprise a rectangular lateral periphery (and specifically a square lateral periphery). It can be advantageous that the pillars 40 have square lateral peripheries in order to increase a packing density of features ultimately imprinted utilizing the reticle substrate 12.

FIG. 9 is a three-dimensional view of the structure of FIGS. 7 and 8, and shows the pillars 40 extending upwardly from a recessed surface of substrate 12.

As discussed above, it is to be understood that the invention also encompasses aspects in which material 12 comprises multiple layers of different materials, and in such aspects the pillars can extend entirely through one or more of the materials. FIGS. 21 and 22 illustrate a construction 200 having a substrate 12 containing a first layer 202 over a second layer 204. FIG. 21 shows the construction prior to formation of openings 42, and FIG. 22 shows the construction after openings 42 are formed through the first layer and to an upper surface of the second layer. Layers 202 and 204 can, for example, comprise compositions selected from the group consisting of Si, $SiO_2$ and calcium fluoride. In a particular example, the topmost layer 202 can consist essentially of, or consist of, silicon dioxide; and the underlying layer 204 can consist essentially of, or consist of, silicon.

The construction 10 of FIGS. 7-9 can be considered to comprise a grid of polygonal pillars etched into an underlying quartz substrate, with the shown pillars having a rectangular (specifically square) lateral periphery. The construction can be utilized as is for imprint lithography of a semiconductor construction. However, due to the limitations of resolution of the optical lithographic patterning of material 14 (FIGS. 3-6) the pillars 40 may be smaller and further spaced from one another than desired. FIGS. 10-13 illustrate exemplary methodology which can be utilized for increasing the size of the pillars, and accordingly reducing a spacing between the pillars. Similar methodology can also be applied to the construction 200 of FIG. 22.

Referring initially to FIGS. 10 and 11, a material 50 is formed over pillars 40 and within the gaps between the pillars. The material 50 has only partially filled the gaps between the pillars 40, and accordingly material 50 has narrowed the gaps between the pillars. Material 50 can comprise any suitable material, and in particular aspects will comprise, consist essentially of, or consist of silicon dioxide. The material 50 can be formed by any suitable method, and in particular aspects will be deposited by chemical vapor deposition (CVD) and/or atomic layer deposition (ALD). It can be desired to utilize ALD, in that such can form a highly conformal layer. The pillars 40 are shown in dashed-line view in FIG. 11 to indicate that the pillars are beneath the material 50. The pillars 40 can be considered to be first pillars, and the combination of the first pillars with the material 50 can be considered to form second pillars which are wider and more closely spaced than the first pillars.

In some aspects of the invention, substrate 12 can be considered a first material, and material 50 can be considered a second material which is deposited over the first material.

Figure 12:
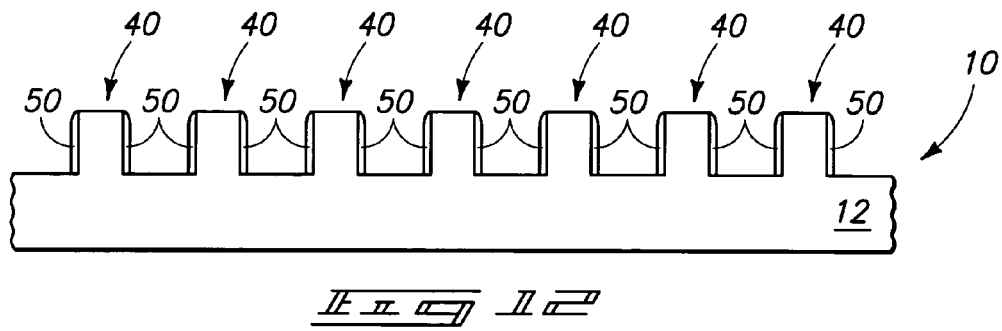
FIGS. 12 and 13 are a diagrammatic cross-sectional view and top view, respectively, of the reticle substrate fragment of FIGS. 1 and 2 shown at a processing stage subsequent to that of FIGS. 10 and 11. The cross-section of FIG. 12 is along the line 12-12 of FIG. 13.
Figure 13:
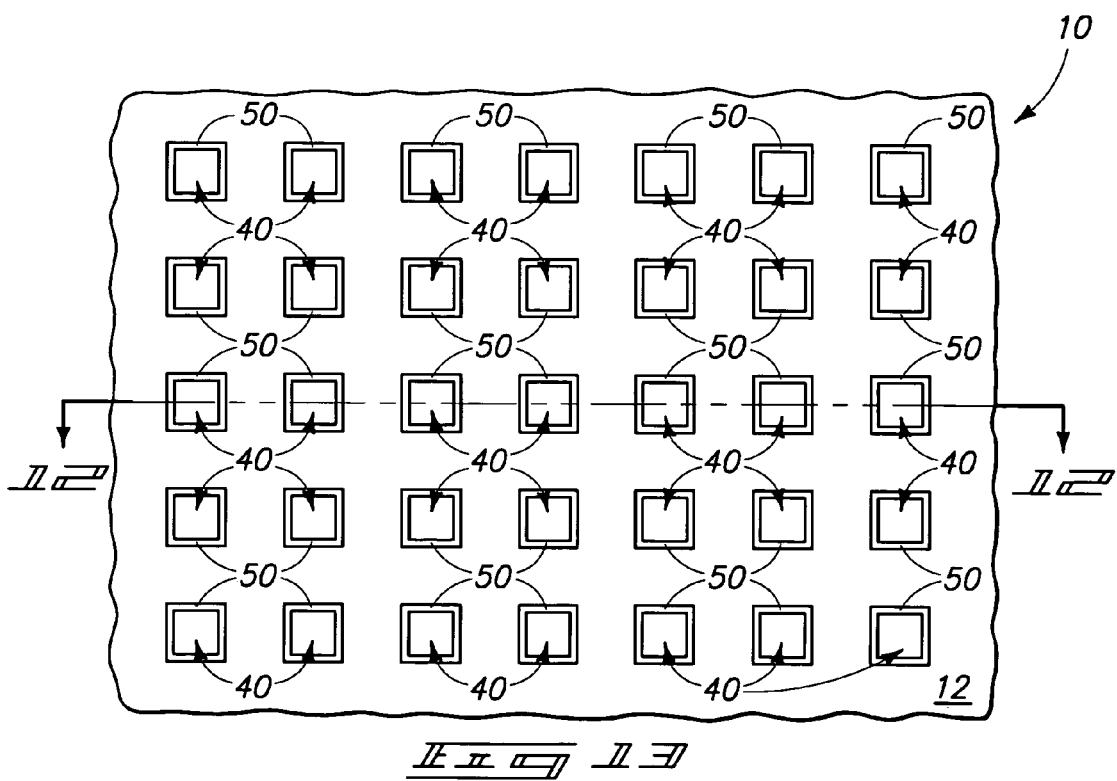

The construction of FIGS. 10 and 11 can be utilized as is for imprint lithography of a semiconductor construction. In other aspects, the construction of FIGS. 10 and 11 can be subjected to an etch which forms sidewall spacers from material 50. FIGS. 12 and 13 illustrate construction 10 after material 50 has been subjected to an anisotropic etch which patterns the material into sidewall spacers along pillars 40. The etch of material 50 utilized to form the structure of FIGS. 12 and 13 has removed material 50 from over at least some portion of the first material segments 47 (labeled on FIG. 7) and from over top surfaces of the pillars 40, while leaving the material 50 along lateral surfaces of the pillars 40. Any suitable etch conditions can be utilized. The etch will be most effective if it is selective for material 50 relative to material 12. Such can occur if material 50 is chosen to be of appropriate composition so that material 50 can be selectively etched relative to substrate 12. It is to be understood that the processing of FIGS. 12 and 13 is optional processing, and that the reticle construction of FIGS. 10 and 11 will frequently be utilizable as a reticle for imprint lithography without further processing.

The reticles discussed above can be utilized as 1× mask for imprint lithography, or as a different level mask (such as, for example, 4× mask) for lithography.

Figure 14:
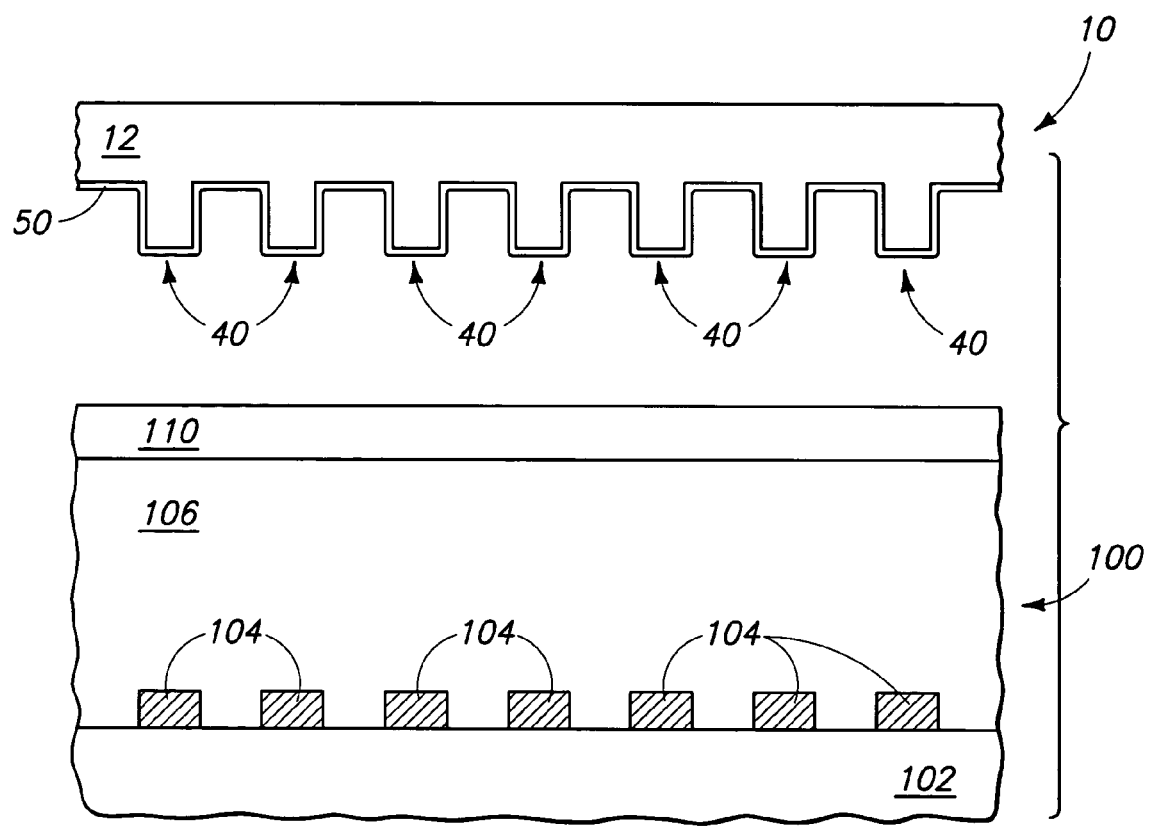
FIG. 14 is a diagrammatic, cross-sectional, fragmentary view of a reticle substrate and semiconductor construction shown at a preliminary processing stage of an aspect of the invention of forming a pattern in a semiconductor construction utilizing imprint lithography.

Referring next to FIG. 14, a reticle construction 10 of the present invention (specifically the reticle of FIG. 10), is shown being utilized to pattern a semiconductor construction 100. The construction 100 comprises a semiconductor substrate 102. Substrate 102 can comprise, consist essentially of, or consist of monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A plurality of electrically conductive nodes 104 (shown as conductive pillars) are supported by substrate 102, and an insulative material 106 is shown extending over and between the conductive nodes 104. Conductive nodes 104 can comprise any suitable composition, or combination of compositions, including, for example, metals, metal compounds, conductively-doped silicon, etc. Insulative material 106 can also comprise any suitable composition or combination of compositions, including, for example, silicon dioxide, silicon nitride, borophosphosilicate glass (BPSG), etc.

The construction 100 is but one of numerous semiconductor constructions which can be patterned utilizing reticles formed in accordance with the present invention. The shown construction is configured for a fabrication of container capacitors in electrical connection with the nodes 104, as will become evident in the discussion and drawings that follow.

A moldable material 110 is formed over construction 100, and in the shown aspect of the invention is formed over electrically insulative material 106. Moldable material 110 can comprise any material suitable for imprint lithography, including, for example, a thermoplastic or a thermoset polymer (such as, for example, poly(methyl methacrylate) (PMMA)), and/or can comprise a light-curable material.

Reticle 10 has a patterning surface defined by the pillars projecting from the reticle. Such patterning surface is pressed into moldable material 110 to form a pattern within the moldable material. The pattern formed within moldable material 110 corresponds to, or at least substantially corresponds to, an inverse image of the patterning surface of reticle 10. Since the patterning surface of reticle 10 has a series of projections defined by the pillars, the pattern formed in the moldable material will have a plurality of openings corresponding to regions where the pillars have pressed into the moldable material. Such openings will have a lateral periphery corresponding to, or at least substantially corresponding to, the lateral periphery of the pillars. Accordingly, in some aspects of the invention the lateral peripheries of the openings formed within moldable material 110 by the imprint lithography will be polygonal, and specifically will be rectangular or square.

Figure 15:
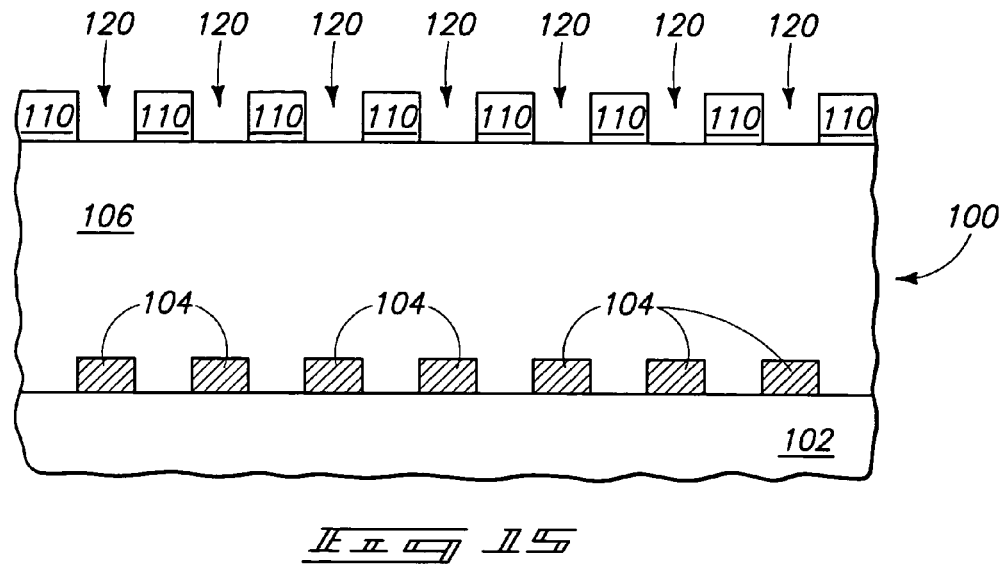
FIGS. 15 and 16 are a diagrammatic cross-sectional side view and top view, respectively, of the semiconductor construction fragment of FIG. 14 shown at a processing stage subsequent to that of FIG. 14. The cross-section of FIG. 15 is along the line 15-15 of FIG. 16.
Figure 16:
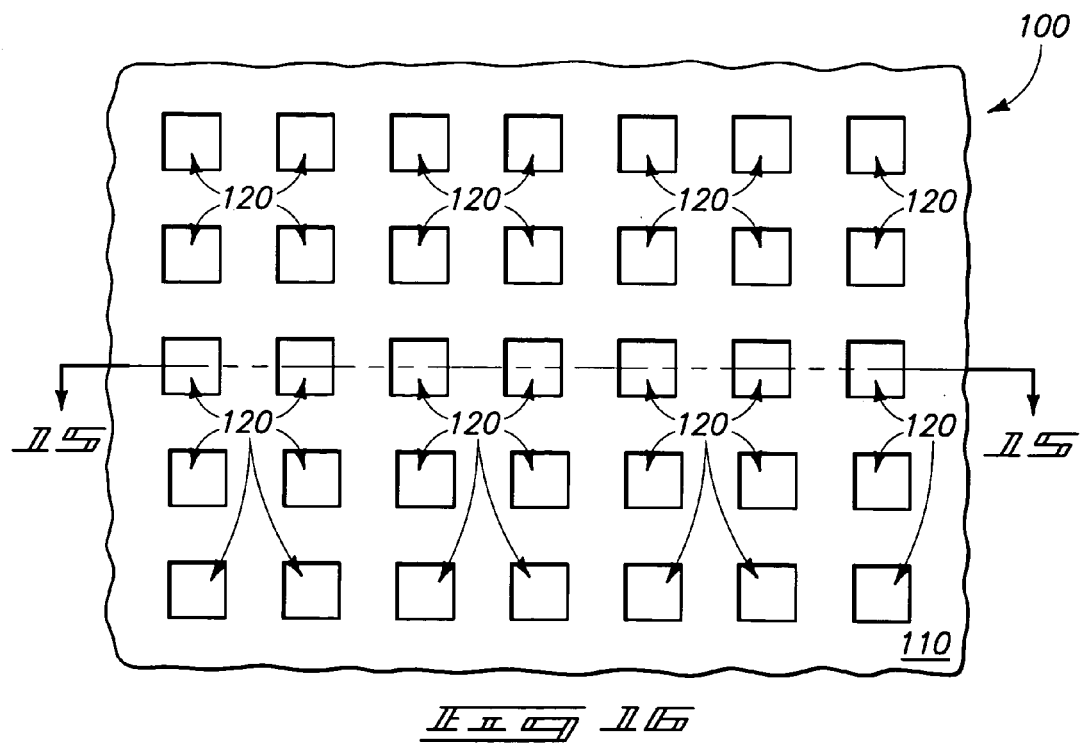

FIGS. 15 and 16 show the moldable material 110 after the imprint lithography has formed a plurality of openings 120 extending through the moldable material.

Figure 17:
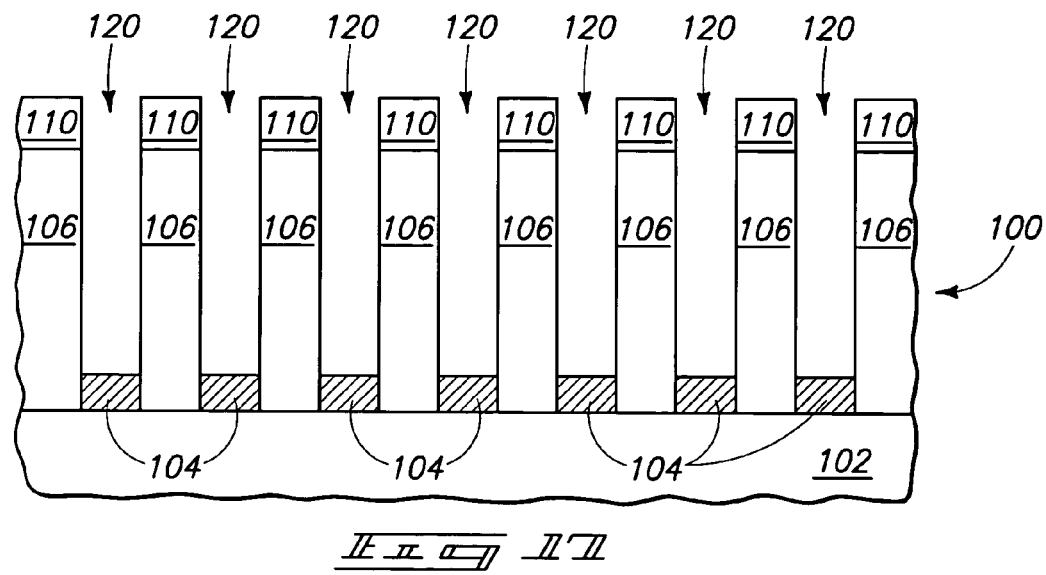
FIGS. 17 and 18 are a diagrammatic cross-sectional side view and top view, respectively, of the semiconductor construction of FIG. 14 shown at a processing stage subsequent to that of FIGS. 15 and 16. The cross-section of FIG. 17 is along the line 17-17 of FIG. 18.
Figure 18:
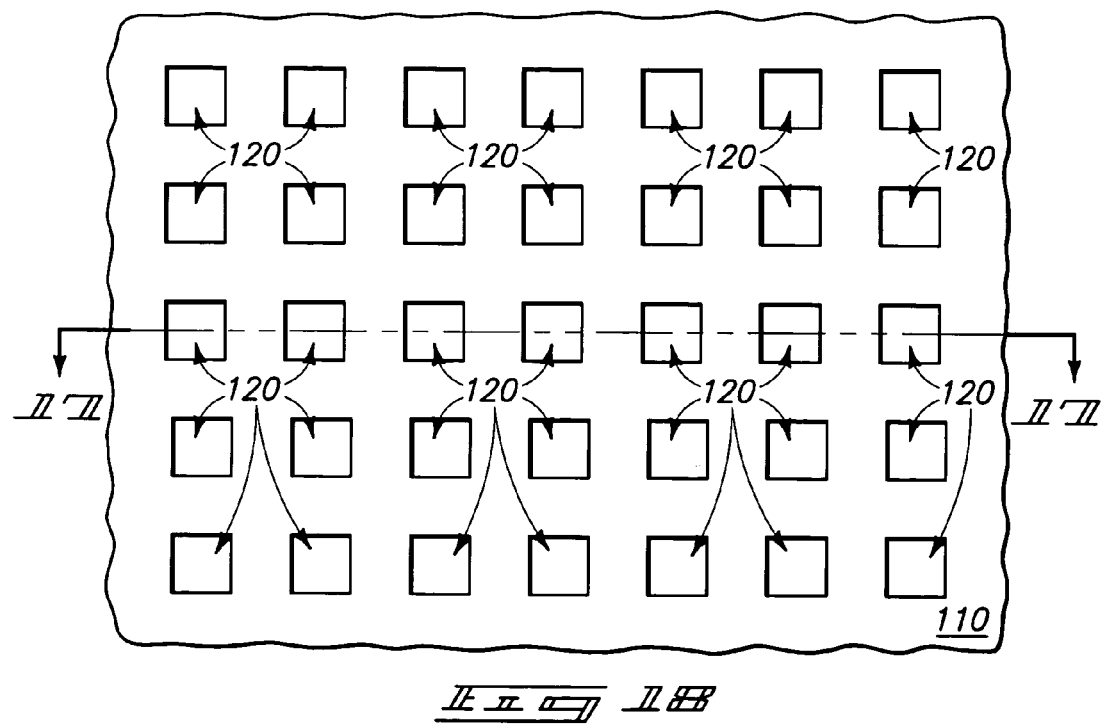

Referring next to FIGS. 17 and 18, the moldable material is utilized as a mask, and a pattern is transferred from the mask into material 106. Specifically, openings 120 are extended into material 106 with a suitable etch. The openings formed in material 106 correspond to a plurality of container openings extending to the conductive nodes 104.

Figure 19:
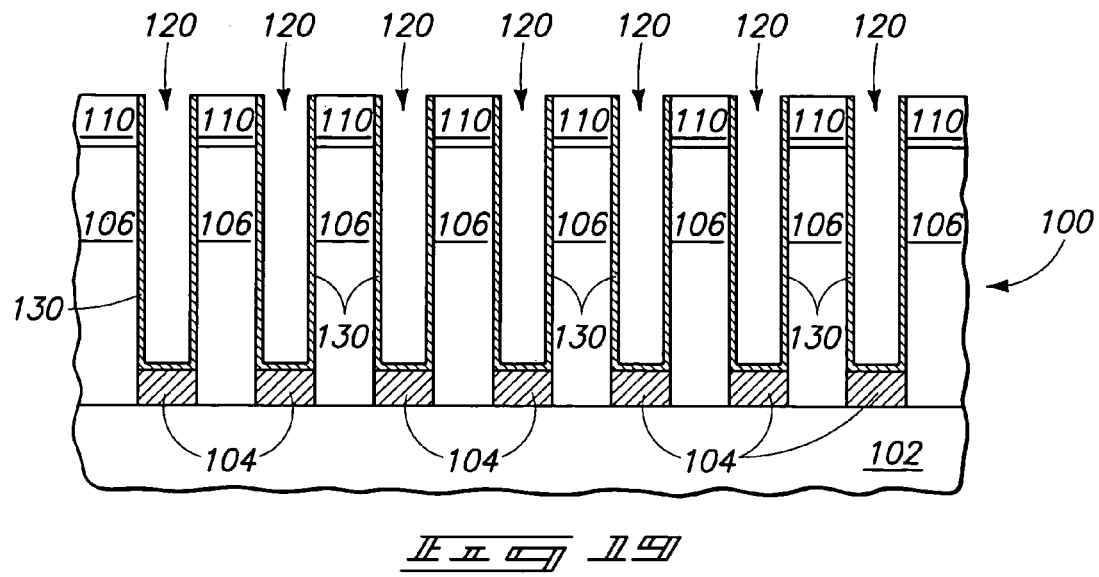
FIG. 19 is a view of the semiconductor construction fragment of FIG. 14 shown at a processing stage subsequent to that of FIG. 17.

Referring next to FIG. 19, moldable material 110 (FIGS. 17 and 18) is removed, and an electrically conductive layer 130 is formed within the openings. Layer 130 can comprise any suitable electrically conductive composition or combination of compositions, including, for example, one or more of metal, metal compounds, and conductively-doped silicon. Conductive material 130 can be formed by any suitable method, including, for example, one or both of atomic layer deposition and chemical vapor deposition. The electrically conductive material 130 would typically be formed as a layer extending over an upper surface of material 106 as well as within the openings 120, and subsequently would be removed from over the upper surface of material 106 by planarization, such as, for example, chemical-mechanical polishing.

Figure 20:
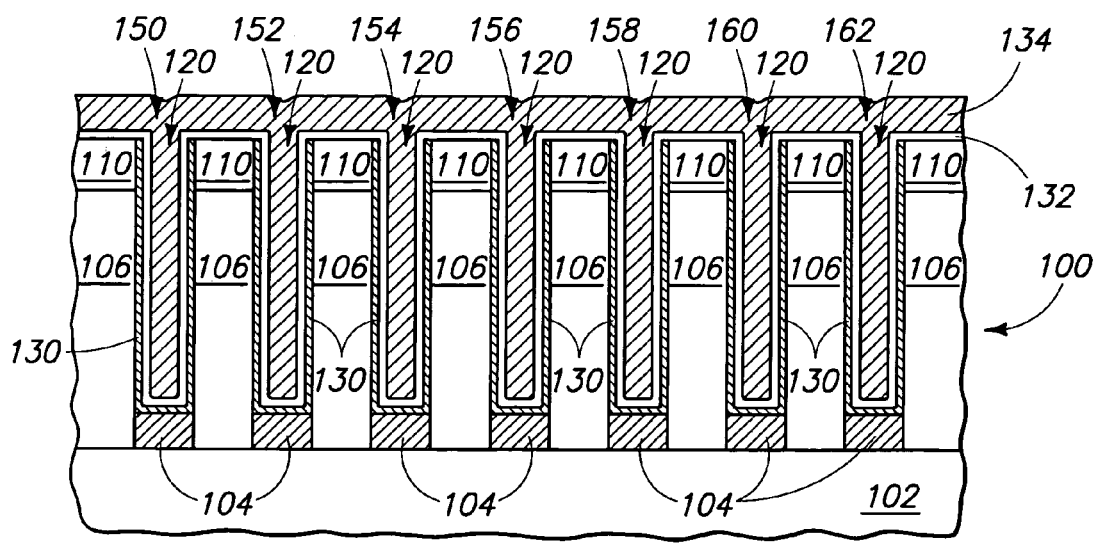
FIG. 20 is a view of the semiconductor construction fragment of FIG. 14 shown at a processing stage subsequent to that of FIG. 19.

Referring next to FIG. 20, a dielectric material 132 and second conductive material 134 are provided over material 106 and within the openings 120. Conductive material 134 can comprise any suitable composition or combination of compositions including, for example, one or more of metal, metal compounds and conductively-doped silicon. Dielectric material 132 can comprise any suitable composition or combination of compositions, including, for example, one or more of silicon dioxide, silicon nitride, or any of various high-k dielectric materials.

The materials 130, 132 and 134 together form a plurality of capacitor constructions 150, 152, 154, 156, 158, 160 and 162 extending with the openings 120. Specifically, the first and second conductive materials 130 and 134 correspond to first and second capacitor electrodes, and the dielectric material 132 capacitively separates such first and second capacitor electrodes from one another.

The shown capacitor constructions correspond to container capacitors, in that the constructions are formed within the containers defined by openings 120. The capacitor constructions can be incorporated into a DRAM array by, for example, providing a plurality of transistor constructions (not shown) in electrical connection with the nodes 104.

The structure of FIG. 20 is but one exemplary structure which can comprise container capacitors suitable for incorporation into a DRAM array, and it is to be understood that the invention can be used to form numerous other structures comprising container capacitors. It is also to be understood that the invention can be utilized for forming other semiconductor constructions alternatively to, or in addition to, container capacitors in various aspects of the invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming capacitors, comprising:
   providing an assembly which includes a semiconductor base supporting a plurality of conductive nodes, and which includes an electrically insulative material over the nodes;
   providing a masking layer over the assembly;
   providing a reticle which has patterning surface;
   pressing the patterning surface into the masking layer to form a pattern within the masking layer, said pattern substantially corresponding to an inverse image of the patterning surface, the pattern having a plurality of indentations within the masking layer;
   extending the indentations through the electrically insulative material to the nodes to form openings through the electrically insulative material;
   forming capacitor first electrodes within the openings to narrow the openings;
   forming capacitor dielectric within the narrowed openings to further narrow the openings;
   forming capacitor second electrodes within the further narrowed openings;
   wherein the patterning surface of the reticle comprises pillars; and
   wherein at least some of the pillars comprise quartz projections that are partially enveloped in silicon dioxide spacers deposited by one or both of CVD and ALD.

2. A method of forming capacitors, comprising:
   providing an assembly which includes a semiconductor base supporting a plurality of conductive nodes, and which includes an electrically insulative material over the nodes;
   providing a masking layer over the assembly;
   providing a reticle which has patterning surface;
   pressing the patterning surface into the masking layer to form a pattern within the masking layer, said pattern substantially corresponding to an inverse image of the patterning surface, the pattern having a plurality of indentations within the masking layer;
   extending the indentations through the electrically insulative material to the nodes to form openings through the electrically insulative material;
   forming capacitor first electrodes within the openings to narrow the openings;
   forming capacitor dielectric within the narrowed openings to further narrow the openings;
   forming capacitor second electrodes within the further narrowed openings;
   wherein the patterning surface of the reticle comprises pillars; and
   wherein at least some of the pillars comprise quartz projections laterally surrounded by silicon dioxide spacers deposited by one or both of CVD and ALD.

3. The method of claim 1 wherein the openings have polygonal lateral peripheries.

4. The method of claim 1 wherein the openings have square lateral peripheries.

5. The method of claim 1 wherein the masking layer comprises thermoplastic polymer.

6. A method of forming capacitors, comprising:
   providing an assembly which includes a semiconductor base supporting a plurality of conductive nodes, and which includes an electrically insulative material over the nodes;
   providing a masking layer over the assembly;
   providing a reticle which has patterning surface;
   pressing the patterning surface into the masking layer to form a pattern within the masking layer, said pattern substantially corresponding to an inverse image of the patterning surface, the pattern having a plurality of indentations within the masking layer;

extending the indentations through the electrically insulative material to the nodes to form openings through the electrically insulative material;

forming capacitor first electrodes within the openings to narrow the openings;

forming capacitor dielectric within the narrowed openings to further narrow the openings;

forming capacitor second electrodes within the further narrowed openings;

wherein the masking layer comprises thermoset polymer;

wherein the patterning surface of the reticle comprises pillars; and wherein at least some of the pillars comprise quartz projections that are partially enveloped in silicon dioxide deposited by one or both of CVD and ALD.

7. The method of claim 1 wherein the silicon dioxide is deposited by ALD.

* * * * *